(12) United States Patent
Wu

(10) Patent No.: US 6,393,210 B1
(45) Date of Patent: May 21, 2002

(54) RAPID THERMAL PROCESSING METHOD AND APPARATUS

(75) Inventor: Hsiao-Che Wu, Taoyuan Hsien (TW)

(73) Assignees: ProMos Technologies, Inc.; Mosel Vitelic Inc., both of Hsinchu (TW); Siemens AG, Munich (DE)

( * ) Notice: Subject to any disclaimer, the term of this patent is extended or adjusted under 35 U.S.C. 154(b) by 0 days.

(21) Appl. No.: 09/469,146

(22) Filed: Dec. 21, 1999

(30) Foreign Application Priority Data

Aug. 23, 1999 (TW) .......................................... 88114359

(51) Int. Cl.[7] ............................................... F26B 19/00
(52) U.S. Cl. ....................... 392/416; 219/390; 219/405; 219/411; 118/724; 118/725
(58) Field of Search ................................ 219/390, 405, 219/411; 118/724, 725, 50.1; 392/416, 418

(56) References Cited

U.S. PATENT DOCUMENTS

| | | | |
|---|---|---|---|
| 4,375,027 A | * | 2/1983 | Zeto et al. ................... 219/390 |
| 4,533,820 A | | 8/1985 | Shimizu |
| 4,558,660 A | * | 12/1985 | Nishizawa et al. ......... 118/725 |
| 4,649,261 A | | 3/1987 | Sheets |
| 4,789,771 A | | 12/1988 | Robinson et al. |
| 5,002,630 A | | 3/1991 | Kermani et al. |
| 5,154,512 A | | 10/1992 | Schietinger et al. |
| 5,269,847 A | * | 12/1993 | Anderson et al. ........... 118/715 |
| 5,444,217 A | | 8/1995 | Moore et al. |
| 5,683,518 A | | 11/1997 | Moore et al. |
| 5,710,407 A | | 1/1998 | Moore et al. |
| 5,834,353 A | | 11/1998 | Wu |
| 5,841,110 A | | 11/1998 | Nenyei et al. |
| 5,937,142 A | | 8/1999 | Moslehi et al. |

* cited by examiner

*Primary Examiner*—Teresa Walberg
*Assistant Examiner*—Shawntina Fuqua
(74) *Attorney, Agent, or Firm*—Alston & Bird LLP

(57) ABSTRACT

An apparatus for the rapid thermal processing of a semiconductor wafer is disclosed. The apparatus includes a preheat unit for preheating a gas composition, and a RTP reactor having a processing chamber and a heat source for heating the wafer. The processing chamber has a wafer holder, and a gas inlet and a gas outlet through which the preheated gas composition flows in and out of the processing chamber.

16 Claims, 3 Drawing Sheets

RAPID THERMAL PROCESSING METHOD AND APPARATUS

FIELD OF THE INVENTION

This invention generally relates to methods and apparatus for processing semiconductor wafers, in particular to rapid thermal processing methods and apparatus for processing semiconductor wafers.

BACKGROUND OF THE INVENTION

Rapid thermal processing (RTP) has become widely used in various stages of semiconductor manufacturing. For example, rapid thermal processing is used for the chemical deposition of various films on semiconductor wafers. Rapid thermal processing has also been used in the annealing of ion or dopant implanted semiconductor wafers. Because the operating temperature in rapid thermal processing can be rapidly increased or decreased, the required processing time is short and the efficiency is high.

In many RTP applications, the heat treatment often needs to be conducted under specific atmospheric conditions with a specific gas composition flowing through the processing chamber where the wafer is being treated. FIG. 1 illustrates an example of a conventional prior art RTP reactor for heat-treating a semiconductor wafer in a flowing gas composition. The reactor 10 has a processing chamber 11 where a semiconductor wafer can be treated. A rotatable susceptor 12 is mounted within the processing chamber 11. A wafer 13 to be processed is held and supported by susceptor 12, and can be rotated along with the rotatable susceptor 12. In addition, the apparatus also has a gas delivery system including a gas inlet 14 at one end of the processing chamber 11, and a gas outlet 15 at the other end of the processing chamber 11. A gas composition typically flows into processing chamber 11 at room temperature, while the operating temperature in processing chamber 11 is very high, e.g., from about 500° C. to about 1200° C. A heat source 16 is located above processing chamber 11 such that the surface of wafer 13 can be radiated by the heat emitted from heat source 16. Heat source 16 comprises a plurality of heating units each having therein a halogen lamp 17.

As is well known in the art, it is critical that during the rapid thermal processing of a wafer, the entire surface of the wafer is heated uniformly. Non-uniformities in temperature distribution across the wafer surface can result in dislocations and distortion in the wafer. However, in conventional rapid thermal processing, it is often very difficult to achieve temperature uniformity across the wafer surface. As is apparent from FIG. 1, it is difficult to design the spatial arrangement of the wafer and the individual heating units so that the radiant heat energy received at each point on the wafer surface is the same. As a result, radial temperature gradients from the edge to the center of the wafer can be formed. In particular, the outer edge of the wafer often receives the least radiation energy. In addition, rapid thermal processing is typically conducted in a very short cycle, e.g., 2–15 minutes. The wafer is rapidly heated to a very high temperature and is cooled rapidly. Any small variations in heat radiation at different points of the wafer surface can cause drastic temperature variations. As a result, the thermal stress at different points of the wafer surface can vary, causing the distortion of the wafer. In the case of rapid thermal chemical vapor deposition, the deposition rate at the different points on the wafer surface can vary because of the temperature non-uniformity, thus resulting in non-uniformity in the thickness of the deposited film.

There has been a great deal of effort in the art in developing satisfactory solutions to the problem of heat non-uniformity. Many different methods have been proposed, and yet the heat non-uniformity problem remains.

U.S. Pat. No. 4,789,771 discloses a number of ways to compensate for thermal non-uniformity. For example, the patent proposes coating the processing chamber walls with a medium to reflect light from the heat lamps, energizing the outermost heat lamps to produce higher temperatures than the centrally located lamps, and varying the spacing of the heat lamps to compensate for thermal non-uniformity.

U.S. Pat. No. 4,533,820 describes a heating apparatus for radiant heating semiconductor wafers in a flowing gas. The apparatus has a processing chamber where a wafer is treated. The gas flows into and out of the processing chamber through a gas inlet and a gas outlet. A gas flow dispersion barrier having a plurality of gas through-holes is disposed within the container. The dispersion barrier is said to improve the gas flow uniformity, thus improving the heat uniformity on the wafer surface.

Much effort has been focused on the real-time control of the radiation energy emitted from individual lamps to achieve heat uniformity. Typically such control systems include measuring temperatures at different points of the wafer surface and adjusting the radiation energy output of different heating units based on the measured temperatures.

In one method, an optical pyrometer is used with a wavelength of two to three micrometer ($\mu$m), to monitor temperatures at different points on the wafer surface. The monitored temperature parameters are then processed by a processor such as a computer to generate a new set of parameters. The power of the individual heating units is then adjusted based on the new parameters to compensate for the temperature differences at different points on the wafer surface to achieve temperature uniformity. However, in this method, in order to achieve temperature uniformity, it is important that accurate temperature measurements are obtained by the pyrometer. In practice, the temperature measurements of the pyrometer often are distorted and inaccurate because of the interference by various factors in the processing. Examples of such factors include the reflectivity of the wafer, the radiation from the radiant lamps, the radiant energy which has passed through the wafer or around it, the radiant energy reflected back by the walls of the processing chamber, and the heat energy generated in the chemical reaction during the deposition process, etc.

To obtain more accurate temperature readings, U.S. Pat. No. 5,154,512 discloses the so-called "ripple technique." The method utilizes a first optical fiber to measure the infrared light emission from the wafer in a narrow band, and a second optical fiber to measure the light emission from the lamps in the same narrow band infrared region. The radiation measured by the first optical fiber is used to determine the light reflected from the wafer. The variation in the measured light reflection is used to deduce the reflection coefficient for the wafer at a particular wavelength. The coefficient is then used to calculate the temperature on the wafer surface based on the radiation collected by the first optical fiber.

U.S. Pat. No. 5,841,110 discloses another control method, which includes measuring the broad band reflectivity of the wafer to be treated before the wafer is placed in the RTP processing chamber. The measured reflectivity is then used by the RTP system to adjust the RTP system parameters used in the rapid thermal processing of the wafer.

Despite the effort in the art, non-uniformity in temperature distribution on wafer surface in rapid thermal processing remains to be a problem. Thus, there is still need in the art for improved rapid thermal processing methods which can achieve better heat uniformity and less distortion in the processed wafer.

SUMMARY OF THE INVENTION

This invention provides a method for rapid thermal processing a semiconductor wafer under atmospheric conditions, e.g., in a flowing gas composition. Improved temperature uniformity on the surface of the wafer being treated can be achieved by the method, resulting in significantly less dislocation or distortion in the processed wafer.

In accordance with the present invention, the gas composition is preheated before it is flushed into the rapid thermal processing chamber. Typically, the gas composition is heated to a preheat temperature that is sufficiently close to the operating temperature of the thermal processing chamber such that when the gas composition reaches the wafer being treated, its temperature is substantially same as the operating temperature. Preferably, the gas composition is preheated to the operating temperature before it flows into the processing chamber. Because the difference between the entering gas temperature and the operating temperature in a processing chamber is drastically reduced or even eliminated, when the gas composition flows into the processing chamber, it will not absorb any substantial amount of heat from the outer edge of the wafer being processed. Thus, the interference with the temperature uniformity on the wafer surface by the entering gas composition is minimized. Improved temperature uniformity can be achieved on the wafer surface.

In another aspect of this invention, a rapid thermal processing apparatus is provided. The apparatus has a preheat unit for preheating a gas composition, and a reactor for the rapid thermal processing of a semiconductor wafer. Typically, the reactor has a processing chamber and a radiant heat source for heating the wafer in the chamber.

In a preferred embodiment, the preheat unit has a preheat chamber, and a preheat source and preheat temperature sensor each being operably coupled to the preheat chamber, a preheat controller operably coupled to the preheat source, and a processor operably coupled to both the preheat controller and the preheat temperature sensor. When a gas composition is preheated, the preheat temperature sensor monitors the temperature of the gas composition, and the preheat controller controls the preheat source. The processor receives signals from the preheat temperature sensor and the preheat controller, processing the signals, and feeding control information to the preheat controller such that the preheat controller adjusts in real time the power of the preheat source in response to the temperature monitored by the preheat temperature sensor.

In another embodiment of the invention, the rapid thermal processing reactor has a wafer temperature monitor for measuring a temperature on a surface of the wafer, and a heat source regulator operably coupled to the radiant heat source for controlling the power of the radiant heat source. The processor receives signals from the preheat temperature sensor, the wafer temperature monitor, the preheat controller and the heat regular, processes the signals, and outputs control information to the preheat controller and the heat source regulator. The preheat controller and the heat source regulator then adjust the power of the preheat source and the radiant heat source respectively according to the control information. As a result, the gas composition is preheated in response to the measured wafer temperature, and the wafer is heated uniformly.

As discussed above, in conventional RTP methods, a gas composition of room temperature is supplied directly into the RTP processing chamber. Because of the drastic difference between the temperature of the gas composition and the operating temperature in the processing chamber, the gas composition can significantly interfere with heat uniformity on the surface of a wafer being treated by absorbing heat from at least the outer edge of the wafer. By preheating the gas composition, the present invention significantly reduces the temperature difference, and improves the temperature uniformity on the wafer surface. As a result, less dislocation and distortion in the processed wafer is caused, and wafers with better qualities can be produced.

DETAILED DESCRIPTION OF THE INVENTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
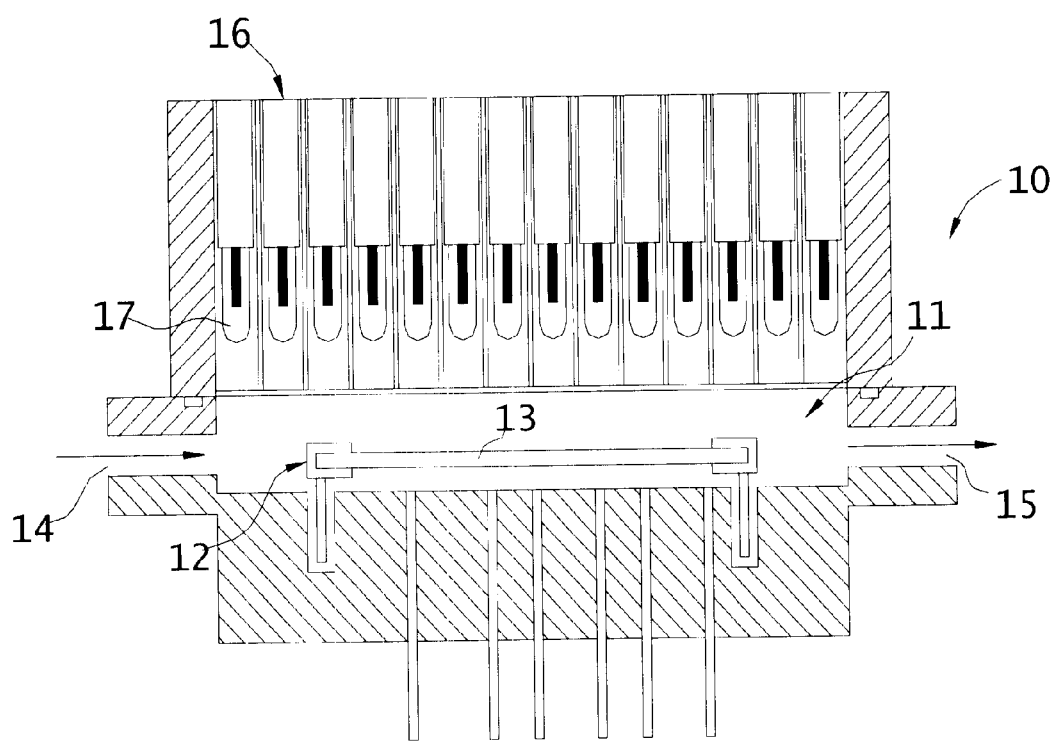
FIG. 1 is a schematic diagram illustrating a prior art RTP reactor.

In accordance with the present invention, a method for thermally processing a semiconductor wafer in a gas composition is provided, which comprises preheating the gas composition before it is supplied into the processing chamber where the wafer is processed. The method of this invention can improve the uniformity in the processed wafer and reduce the occurrence of dislocations and distortion in the processed wafer. While not wishing to be bound by any particular theory, it is believed that this is because the method of this invention significantly improves the heat uniformity during the heat treatment of the wafer. In a conventional rapid thermal processing method using an apparatus illustrated in FIG. 1, a flowing gas composition typically is supplied at room temperature, i.e., about 25° C., while the operating temperature within the processing chamber 11 is typically very high, e.g., from about 500° C. to about 1200° C. As the gas composition flows into the processing chamber 11 via the gas inlet 14 and flows through the wafer 13, it is rapidly heated and its temperature rapidly increases. Nevertheless, because the initial temperature of the gas composition is significantly lower than the operating temperature in the processing chamber, a temperature gradient is typically created which overlaps the wafer edge proximate to gas inlet 14. As the gas composition flows through the wafer towards the gas outlet, it absorbs the heat from the environment including the wafer surface until it reaches the same temperature as the operating temperature in the processing chamber. Typically, the cold gas composition absorbs heat from the outer edge of the wafer proximate to the gas inlet, thus decreasing the temperature at the edge. However, the feedback method in the art for controlling the output power of the radiant heat source based on temperature measurements typically cannot respond fast enough to offset the effect of the cold gas. As a result, the flowing gas composition typically causes the non-uniform temperature distribution across the wafer surface. The non-uniformity in temperature distribution can significantly affect the quality of the processed wafer.

The method and apparatus of this invention can be used in many different heat treatment applications in which a gas composition is employed to flow through the object being treated. For example, the method can be used in thermal chemical vapor deposition for forming various types of film, e.g., on a semiconductor wafer. The method can also be used in the thermal annealing of ion or dopant implanted semiconductor wafer, sintering metal contacts to enhance the metal-semiconductor contact after the deposition of metal film, forming silicide-silicon ohmic contacts, and the like. While this invention is suitable for conventional thermal processing of objects such as semiconductor wafers, it is especially useful in the rapid thermal processing (RTP) of semiconductor wafers.

Typically, the apparatus of this invention includes a preheat unit for preheating a gas composition, and a reactor for the heat treatment of an object such as a wafer. Suitable reactors include any reactors useful in the thermal processing of, e.g., semiconductor wafers in a flowing gas composition. When the invention is used in rapid thermal processing (RTP) of semiconductor wafers, any RTP reactors known in the art can be used. Conventional RTP reactors which generally process only one wafer at a time can be used. Other RTP reactors capable of processing more than one wafer at a time, such as those disclosed in U.S. Pat. No. 5,710,407 can also be used.

As is known in the art, a RTP reactor typically has a processing chamber in which a wafer can be thermally processed, and a heat source that generates energy for heating the wafer surface. Typically, a radiant heat source is used, which has one or more heating units, each having a heating lamp. The heating lamp emits radiant energy having a wavelength of, e.g., up to 500 $\mu$m, preferably less than 50 $\mu$m, more preferably less than about 10 $\mu$m, and advantageously less than about 1 $\mu$m. Suitable heating lamps include, e.g., halogen lamps, tungsten-halogen lamps, xenon arc, krypton arc, mercury arc, electrodeless radio frequency (RF) sources, laser sources, etc.

Generally, a RTP processing chamber is a tube-like container with a gas inlet and gas outlet at two opposite ends. Optionally, one or more gas flow dispersion barrier as disclosed in U.S. Pat. No. 4,533,820 can be included in the processing chamber, especially at a location proximate to the gas inlet, to improve the gas flow uniformity. The radiant heat source can be mounted inside the container. Alternatively, when a transparent processing chamber, e.g., a cylindrical quartz tube, is used, the radiant heat source can be mounted outside of and operably coupled to, the processing chamber such that the radiant energy from the heat source can transmit through the transparent processing chamber to heat the wafer located in the processing chamber. Typically, a susceptor or wafer holder is operably mounted in the processing chamber for holding the wafer transverse to the axis of the tube and exposing the wafer surface to be heat treated to the heat source. Any conventional susceptors can be used. Preferably, the susceptor is rotatable such that the wafer can be rotated during the RTP processing.

The RTP reactor may also have a control system for monitoring the temperature on the surface of the wafer being treated and adjusting the amount of the radiant energy emitted from the individual heating units of the heat source. Typically, the control system includes one or more wafer temperature monitors, e.g., pyrometers, for measuring a temperature on a surface of the wafer, a heat regulator operably coupled to the radiant heat source for controlling the power of the radiant heat source, and a processor operably coupled to the heat regulator and the temperature monitor. The monitor transmits signals or information about the temperature on the wafer surface to the processor. The heat regulator transmits the output power signal of each individual heating unit to the processor. The processor, typically a computer, then processes the signals, generates control information, and feeds the control information to the regulator to adjust the output power of the individual heat units to achieve heat uniformity on the wafer surface. Any conventional control systems known in the art can be used. For example, the so called "ripple techniques" disclosed in U.S. Pat. No. 5,154,512, the non-contact pyrometric technique described in U.S. Pat. No. 5,154,512, and the like, can all be used in the present invention. In addition, the various methods described in U.S. Pat. No. 4,789,771 for compensating for thermal non-uniformity of the processing chamber, e.g., optimizing the spacing of the heat lamps, coating the chamber walls to reflect light from heat lamps, and the like, may all be employed in this invention.

In accordance with the present invention, a preheat unit is operably coupled to a reactor. The preheat unit preheats a gas composition used in the thermal processing of a wafer in the reactor. Gas compositions useful in the thermal processing of wafers are generally known in the art. Different gas compositions are required for different applications and at different stages in one application. For example, in chemical vapor deposition (CVD) of silicon films, the gas composition may contain a silicon source such as chloronated silicon (e.g., dichlorosilane, dihydrogen dichlorosilane, etc.), and optionally hydrogen and an inert carrier gas (e.g., xenon, neon, krypton, argon, etc.). In gallium arsenide processing, the gas composition may contain arsene and hydrogen. In the chemical vapor deposition of a silicon nitride film, the gas composition can have hydrazine, silane, and an inert carrier gas (e.g., xenon, neon, krypton, argon, etc.). This invention is particularly useful in RTP annealing of a semiconductor wafer, where a gas composition having $N_2$, $N_2O$, NO, or $NH_3$ and the like in admixture with an inert gas described above is typically used. In a rapid thermal oxidation process, a gas composition having oxygen optionally in admixture with an inert gas is used.

The preheat unit can have a preheat chamber in which a gas composition is heated to a predetermined preheat temperature. The chamber can have an entrance for the gas composition to enter the chamber, and an exit for exhausting the preheated gas composition. Preferably, the exit of the preheat chamber is operably coupled to the gas inlet of the processing chamber in the reactor such that the preheated gas composition can enter the processing chamber as soon as it exits from the preheat chamber without being exposed to a low temperature environment. The preheat chamber can be of any shapes and configurations so long as a gas composition can be conveniently preheated to a predetermined preheat temperature therein and can be easily exhausted into a processing chamber.

The preheat unit also has a preheat source operably coupled to the preheat chamber for generating energy to preheat the gas composition. The preheat source can be of any types of heat-generating devices. Preferably a resistant heat source is employed, e.g., an electric heating rod or surface, which can be operably mounted in the preheat chamber.

Some gases, especially reactive gases, may undergo chemical reactions when they are subjected to certain high temperature conditions. As will be apparent to a skilled artisan, undesirable chemical reactions can be prevented by controlling the energy emitted from the preheat source. In other words, the energy generated by the preheat source preferably is controlled such that the gas composition is preheated to a relatively high temperature while the chemical properties of the gas composition are not materially changed, i.e., no substantial chemical reaction is caused among the various components in the gas composition or between the gas composition and the materials in the equipment. In addition, the components of a gas composition can also be selected such that the gas composition can be preheated to a desirable preheat temperature without causing significant chemical reactions among the components. The selection of gas components and optimum heat energy for a particular gas composition should be apparent to a skilled artisan apprised of the present invention.

In a preferred embodiment, the preheat unit has a control system for monitoring the gas composition temperature and controlling the output power of the preheat source in real time to preheat the gas composition to a desired preheat temperature. For example, the control system can simply be those used in conventional heating devices for heating a liquid or gas and maintaining a constant temperature, as is generally known in the art. In such control systems, a turnable knob or switch, or a panel can be used to set the predetermined preheat temperature and the power of the preheat source can be turned on and off automatically through an electrical circuit.

Alternatively, the preheat unit can have a preheat temperature sensor operably coupled to the preheat chamber for monitoring the temperature of the gas composition being preheated. The sensor can be a high temperature thermometer or any other conventional devices suitable for measuring high temperatures. Preferably, the temperature sensor is an electronic sensor capable of monitoring the gas composition temperature and converting the temperature readings into electronic or digital signals, and transmitting such signals to a processor. In addition, a preheat controller is operably coupled to the preheat source for controlling the output power of the preheat source. Preferably, the controller transmits the output power signal to the processor and receives control information, e.g., a digital or electronic signal from the processor and adjusts the output power of the preheat source based on the control information. The processor can be, e.g., a computer which can compare the actual gas composition temperature with the preset preheat temperature and determine whether the output power of the preheat source needs to be increased or decreased in order to preheat the gas composition in the preheat chamber to the preheat temperature.

The preheat temperature, i.e., the temperature the gas composition is to be heated to in the preheat chamber, is chosen such that when it enters the processing chamber where a wafer is heat treated, the preheated gas composition absorbs substantially less heat from the wafer than when the gas composition is not preheated. Preferably, the gas composition is preheated to a sufficiently high temperature such that when the gas composition enters the processing chamber and reaches the outer edge of the wafer that is proximate to the gas inlet, the temperature of the gas composition is substantially same as the operating temperature in the processing chamber. Typically, a gas composition is preheated such that the difference between its temperature and the operating temperature in the processing chamber is no greater than about 800° C., preferably no greater than about 500° C., more preferably no greater than about 300° C., and most preferably no greater than about 100° C. Advantageously, the gas composition is preheated in the preheat unit to about the operating temperature in the processing chamber. As is known in the art, the operating temperature in the processing chamber can vary with different thermal processing applications. Typically, it can range from, e.g., about 400° C. to about 1400° C., preferably from about 800° C. to about 1200° C., although operating temperatures beyond such ranges have also been used. Thus, the preheat temperature can vary as well, as is apparent to a skilled artisan.

In a preferred embodiment, the same computer or a comparable device is used as the processor for both the preheat unit and the thermal processing reactor. In this case, the processor receives signals from the preheat temperature sensor, the wafer temperature monitor, the preheat controller and the heat regulator, compares the actual temperature of the gas composition being preheated against the wafer surface temperature, compares the temperatures at different points on the wafer surface, generates control information, and transmits the control information to the preheat controller and the heat regulator. As a result, the output power of the preheat source can be adjusted in response to the wafer surface temperature. In the meantime, the output power of the individual heating units in the radiant heat source of the processing reactor is adjusted so that the wafer surface is heated uniformly.

The invention is further illustrated by the following examples with reference to schematic diagrams.

Figure 2:
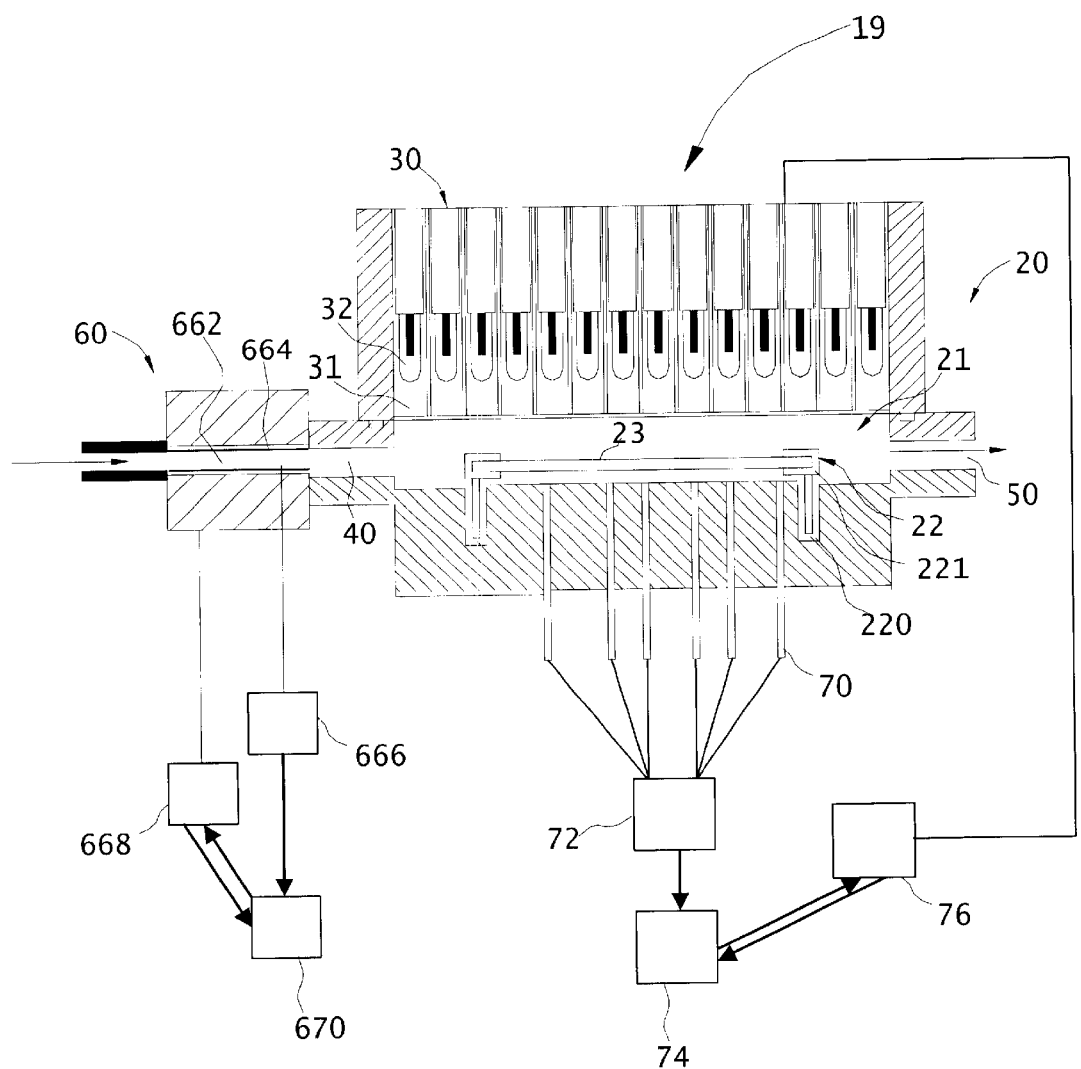
FIG. 2 is a schematic diagram demonstrating a RTP apparatus of this invention.

FIG. 2 is a schematic diagram illustrating an embodiment of the apparatus of this invention. The RTP apparatus 19 has a RTP reactor 20 and a preheat unit 60. RTP reactor 20 has a processing chamber 21. In processing chamber 21, a wafer holder 22 is operably coupled to the processing chamber 21. During the RTP processing, a wafer can be held by wafer holder 22. Wafer holder 22 can be rotated during processing thus rotating wafer 23 in the processing chamber during processing. As a result of the rotation, more uniform heating of the wafer can be achieved. Wafer holder 22 has a pair of rotatable posts 220, which can be made of quartz or graphite. Each post 220 has a wafer surround ring 221 for holding wafer 23.

A heat source 30 is operably coupled to the processing chamber 21 such that the heat generated by the heat source 30 can be transmitted to the surface of wafer 23. Typically, heat source 30 comprises a plurality of heating units 31, each having a tungsten-halogen lamp 32, which generates radiant energy.

Processing chamber 21 also has a gas inlet 40 at one end of the chamber, through which a gas composition can be supplied into the processing chamber 21. The processing chamber 21 also has gas outlet 50 at another end of the chamber, through which a gas composition can exit from the processing chamber 21. Wafer holder 22, and gas inlet 40 and gas outlet 50 are so positioned such that during wafer processing, a gas composition can enter through gas inlet 40, pass through wafer 23 and exit at gas outlet 50. The gas composition has a gas such as argon, nitrogen, oxygen, hydrazine, silane, and a mixture thereof. The selection of a gas is determined by the application of the RTP processing, which should be apparent to a skilled artisan. For example, in a rapid thermal annealing process, typically argon or nitrogen is used, while in a rapid thermal oxidation process, the gas composition typically contains oxygen. A gas composition can be flushed into the processing chamber by a pump, or a blower, or a comparable supplying device, and can exit the processing chamber through the use of a device such as a vacuum pump and the like.

The apparatus of this invention also has a preheat unit 60 operably coupled to the reactor 20. The preheat unit 60 is used to preheat the gas composition to a predetermined, preheat temperature before the gas composition is supplied into processing chamber 21. As illustrated in FIG. 2, typically preheat unit 60 can be connected to gas inlet 40 of reactor 20 such that the preheated gas composition enters the processing chamber 21 as soon as it exits from preheat unit 60. In the embodiment illustrated in FIG. 2, preheat unit 60 has a preheat chamber 662, in which the gas composition is preheated as it passes through. The preheat unit 60 also has a preheat source 664, which generates heat energy. In addition, preferably, preheat unit 60 also has a preheat temperature sensor 666, operably coupled to preheat chamber 662 so that the temperature of the gas composition can be monitored. In addition, a preheat controller 668 is operably mounted to the preheat chamber for controlling and monitoring the output power of preheat source 664. Signals generated by preheat temperature sensor 666 and preheat controller 668 are transmitted to processor 670 which processes the signals and compares the actual temperature of the gas composition with the predetermined preheat temperature, and generates control information and supplies the control information to controller 668. Controller 668 then increases or decreases the output power of the preheat source 664 according to the control information from processor 670.

Typically, RTP reactor 20 also has a feedback controlling mechanism. A plurality of sensors 70 are operably coupled to processing chamber 21 for detecting temperature signals at a different points on the surface of wafer 23. Typically, sensors 70 comprise optical fibers. An optical pyrometer 72 transfers the temperature signals to processor 74, which processes the signals and generates controlling information which are transmitted to heat regulator 76. Regulator 76 then adjusts the output power of the tungsten-halogen lamp in one or more heating units 31 of heat source 30 to improve heat uniformity on the surface of wafer 23.

Figure 3:
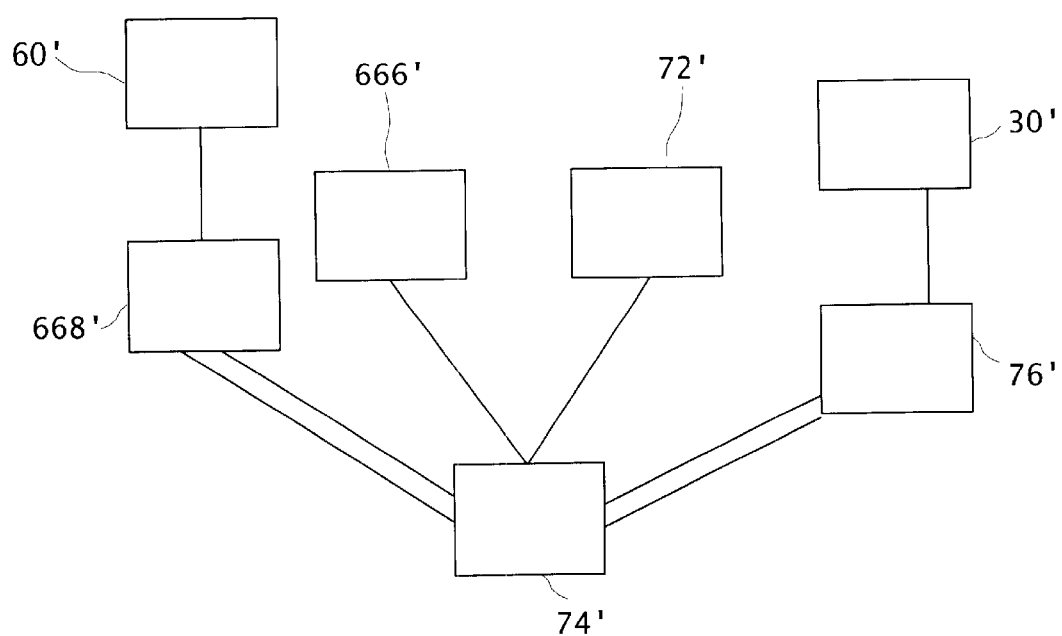
FIG. 3 is a flow chart illustrating the controlling system in one embodiment of this invention.

In a modified version of the above described embodiment, the two processors associated with the preheat unit and the RTP reactor respectively are combined into one single processor 74' as illustrated in FIG. 3. Thus, processor 74' receives temperature signals from preheat temperature sensor 666' and pyrometer 72', and output power signals from preheat controller 668' and heat regulator 76'. Processor 74' processes the signals, compares the temperature of the gas compensation being preheated and wafer surface temperature, and generates control information for the controller and regulator to adjust the output power of the preheat source in the preheat unit and/or the lamps of the heat source in the RTP reactor. As a result, the gas composition can be preheated to a sufficiently high temperature such that when it enters the processing chamber of the RTP reactor, it will not absorb a substantial amount of heat from the wafer being treated. In addition, the output power, i.e., the radiation energy emitted from the lamps in the heat source of the RTP reactor is adjusted to improve the heat uniformity on the wafer surface.

The following example illustrates that the energy required to preheat a gas composition to the operating temperature in a typical RTP process is minimal.

In the example, Cp represents the heat capacitor of a particular gas expressed with a unit of cal/mole×k. The value of Cp can vary with different types of gas. For example, the heat capacitor is 4.968 for argon, 6.961 for nitrogen, and 7.016 for oxygen. Vm represents the molecular volume of a particular gas at 25° C. under ambient pressure. Vm for oxygen is 24.6 liter/mole. Tw represents the preheat temperature of a gas composition and Tg represents the original temperature of the gas composition that has not been preheated; f represents the heat efficiency of the preheat unit in this invention; ΔTg equals Tw−Tg. Fg represents the flow rate of the gas composition being preheated.

Thus the energy required to preheat a gas composition can be calculated by the formula $$\Delta Hg = Cp \times \Delta Tg \times Fg \div Vm \div f$$

assuming oxygen is preheated from room temperature, i.e., 25° C. to 800° C., which is a typical operating temperature in a RTP process, f=5%, and the flow rate Fg=10 liter per mole.

$$\begin{aligned}
\Delta Hg &= Cp \times \Delta Tg \times 10 \div 24.6 \div f \\
&= 0.4065 \times CP \times \Delta Tg \div f\,(\text{cal/min}) \\
&= 0.0284 \times CP \times \Delta Tg \div f\,(\text{watt}) \\
&= 0.0284 \times 7.016 \times (800 - 25) \div 0.05 \\
&= 3088\ \text{watt}
\end{aligned}$$

Thus, only about 3.1 kw of heat energy is required to preheat one mole of oxygen from room temperature to about 800° C. It will be apparent to a skilled artisan that the gas composition can be preheated to a temperature that is lower than the operating temperature in the processing chamber of an RTP reactor, in which case the heat energy required is even less. However, once a gas composition is preheated to a temperature that is sufficiently high, the gas composition will not absorb any substantial amount of heat from the wafer being treated and thus will not interfere with the temperature uniformity on the wafer surface. As a result, the wafer processed by the method of this invention has an improved uniformity in both wafer thickness and resistivity as compared to a wafer processed using a conventional RTP process. Accordingly, this invention provides a simple and economical rapid thermal processing method and apparatus thereof.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method for thermally processing a semiconductor wafer in a processing chamber at an operating temperature, wherein a gas composition flows through the wafer while the wafer is processed, said method comprising the steps of:

preheating said gas composition to a preheat temperature;

supplying the preheated gas composition into said processing chamber while heat treating said wafer;

directly measuring a temperature of the wafer; and adjusting said preheat temperature in response to the measured temperature of the wafer.

2. The method of claim 1, wherein said preheat temperature is selected such that when the gas composition reaches the wafer, the temperature of said gas composition is about the same as the operating temperature of said processing chamber.

3. The method of claim 1, wherein said preheat temperature is about the same as the operating temperature of said process chamber.

4. The method of claim 1, wherein said operating temperature is from about 800° C. to about 1200° C.

5. The method of claim 1, wherein said gas composition comprises gas selected from the group consisting of argon, nitrogen, oxygen, hydrazine, silane, and a mixture thereof.

6. A method for rapid thermal processing (RTP) of a semiconductor wafer in a processing chamber, said method comprising the steps of:

preheating a gas composition to a preheat temperature;

heating said wafer in the processing chamber with radiant energy provided from a radiant heat source while flushing the preheated gas composition through the processing chamber;

measuring a temperature of the wafer;

adjusting the power of the radiant heat source in response to the measured temperature; and adjusting said preheat temperature in response to the measured temperature.

7. The method of claim 6, wherein said gas composition comprises a gas selected from the group consisting of argon, nitrogen, oxygen, hydrazine, silane, and a mixture thereof.

8. The method of claim 6, wherein said wafer is processed in said processing chamber at an operating temperature, and wherein said preheat temperature is substantially same as the operating temperature.

9. The method of claim 6, wherein the RTP is rapid thermal chemical vapor deposition.

10. The method of claim 6, wherein the RTP is rapid thermal oxidation.

11. A method for rapid thermal processing (RTP) of a semiconductor wafer in a processing chamber, said method comprising the steps of:

preheating a gas composition to a preheat temperature, wherein said preheating step comprises detecting the temperature of said gas composition, and controlling the preheating in response to the detected temperature;

heating said wafer in the processing chamber with radiant energy provided from a radiant heat source while flushing the preheated gas composition through the processing chamber;

measuring a temperature of the wafer; and adjusting the power of the radiant heat source in response to the measured temperature.

12. An apparatus for thermally processing a semiconductor wafer, comprising:

a preheat unit for preheating a gas composition;

an ATP reactor having a processing chamber and a heat source for heating the wafer, wherein said processing chamber has a gas inlet and a gas outlet through which the preheated gas composition flows in and out of the processing chamber, and wherein said heat source is a radiant heat source for heating a semiconductor wafer;

a wafer temperature monitor for directly measuring a temperature of the wafer; and means for measuring a temperature on a surface of the wafer and means for controlling the preheat unit in response to the measured wafer surface temperature.

13. The apparatus of claim 12, further comprising means for adjusting the power of said heat source in response to the measured temperature.

14. The apparatus of claim 12, wherein the gas composition comprises gas selected from the group consisting of argon, nitrogen, oxygen, hydrazine, silane, and a mixture thereof.

15. An apparatus for thermally processing a semiconductor wafer, comprising:

a preheat unit for preheating a gas composition, said preheat unit comprising:

a preheat chamber;

a preheat source operably coupled to the preheat chamber for generating energy to preheat the gas composition;

a preheat temperature sensor operably coupled to the preheat chamber for monitoring a temperature of the gas composition;

a preheat controller operably connected to the preheat source for controlling the power of the preheat source; and a processor operably coupled to the preheat controller and the preheat temperature sensor for receiving signals from the preheat temperature sensor and the preheat controller, processing the signals, and feeding control information to the preheat controller such that the preheat controller adjusts in real time the power of the preheat source in response to the temperature monitored by the preheat temperature sensor thereby preheat the gas composition to the preheat temperature;

an ATP reactor having a processing chamber and a heat source for heating the wafer, wherein said processing chamber has a gas inlet and a gas outlet through which the preheated gas composition flows in and out of the processing chamber, and wherein said heat source is a radiant heat source for heating a semiconductor wafer; and a wafer temperature monitor for directly measuring a temperature of the wafer.

16. The apparatus of claim 15, wherein the RTP reactor further comprises a wafer temperature monitor for measuring a temperature on a surface of the wafer; and a heat regulator operably coupled to the radiant heat source for controlling the power of the radiant heat source, wherein said processor receives signals from the preheat temperature sensor, the wafer temperature monitor, the preheat controller, and the heat regular, processes the signals, and outputs control information to the preheat controller and the heat regulator such that the preheat controller and the heat regulator adjust the power of the preheat source and the radiant heat source respectively in real time.

* * * * *